United States Patent [19]
Sopori

[11] Patent Number: 5,223,453
[45] Date of Patent: Jun. 29, 1993

[54] CONTROLLED METAL-SEMICONDUCTOR SINTERING/ALLOYING BY ONE-DIRECTIONAL REVERSE ILLUMINATION

[75] Inventor: Bhushan L. Sopori, Denver, Colo.

[73] Assignee: The United States of America as represented by the United States Department of Energy, Washington, D.C.

[21] Appl. No.: 671,230

[22] Filed: Mar. 19, 1991

[51] Int. Cl.$^5$ .......................................... H01L 21/26
[52] U.S. Cl. .................................................. 437/173
[58] Field of Search .................. 437/173, 174, 942; 148/DIG. 3, DIG. 4, DIG. 90

[56] References Cited

U.S. PATENT DOCUMENTS

| | | | |
|---|---|---|---|
| 3,600,797 | 8/1971 | Bower | 148/DIG. 3 |
| 4,193,183 | 3/1980 | Klein . | |
| 4,335,362 | 6/1982 | Salathe et al. . | |
| 4,359,486 | 11/1982 | Patalong et al. . | |
| 4,525,221 | 6/1985 | Wu . | |
| 4,566,177 | 1/1986 | Van de Ven et al. . | |
| 4,632,713 | 12/1986 | Tiku . | |
| 4,649,059 | 3/1987 | Eden et al. . | |
| 4,681,795 | 7/1987 | Tuckerman | 437/173 |
| 5,094,977 | 3/1992 | Yu et al. | 148/DIG. 90 |

FOREIGN PATENT DOCUMENTS 74378 4/1986 Japan ................................. 437/942

OTHER PUBLICATIONS

B. L. Sopori, Fabrication of Diode Arrays for Photovoltic Characterization of Silicon Substrates, Solar Energy Research Institute, Appl. Phys. Lett. 52 (20) May 16, 1988.

Primary Examiner—Brian E. Hearn
Assistant Examiner—Linda J. Fleck
Attorney, Agent, or Firm—Kenneth Richardson; John M. Albrecht; William R. Moser

[57] ABSTRACT

Metal strips deposited on a top surface of a semiconductor substrate are sintered at one temperature simultaneously with alloying a metal layer on the bottom surface at a second, higher temperature. This simultaneous sintering of metal strips and alloying a metal layer on opposite surfaces of the substrate at different temperatures is accomplished by directing infrared radiation through the top surface to the interface of the bottom surface with the metal layer where the radiation is absorbed to create a primary hot zone with a temperature high enough to melt and alloy the metal layer with the bottom surface of the substrate. Secondary heat effects, including heat conducted through the substrate from the primary hot zone and heat created by infrared radiation reflected from the metal layer to the metal strips, as well as heat created from some primary absorption by the metal strips, combine to create secondary hot zones at the interfaces of the metal strips with the top surface of the substrate. These secondary hot zones are not as hot as the primary hot zone, but they are hot enough to sinter the metal strips to the substrate.

10 Claims, 1 Drawing Sheet

CONTROLLED METAL-SEMICONDUCTOR SINTERING/ALLOYING BY ONE-DIRECTIONAL REVERSE ILLUMINATION

CONTRACTUAL ORIGIN OF THE INVENTION

The U.S. Government has rights in this invention under Contract No. DE-AC02-83CH10093 between the U.S. Department of Energy and the Solar Energy Research Institute, a Division of Midwest Research Institute.

BACKGROUND OF THE INVENTION

1. Field of the Invention

The present invention relates to the processing of metallized semiconductor substrates in general, and more specifically to a method of simultaneously alloying and sintering metallic layers to a semiconductor substrate.

2. Brief Description of the Prior Art

Forming thin, conductive metal layers on semiconductor substrates is an essential step in the manufacture of microelectronic and optoelectronic devices to provide electric contacts or current carrying paths to and from the semiconductor material. During manufacture, such thin metal layers, or contacts, are applied to semiconductor substrates, typically silicon, by any one of several well-known deposition techniques, such as vapor deposition, sputtering, or electrolytic precipitation. While such deposition techniques bond the metal layers to the semiconductor substrate, the bond formed by such deposition techniques is typically not sufficient, either mechanically or electrically, to yield reliable, and sometimes even functional, devices. Consequently, the semiconductor must be processed further to improve the bonds between the conductive metal layers and the semiconductor material, for example, by either alloying or sintering the metal layers to the semiconductor surface.

Sintering and alloying are two different processes that are used in semiconductor fabrication and which result in different electrical and mechanical characteristics, such as contact resistance, ohmicity, and bonding. Alloying generally creates a better bond and electrical contact with silicon, because the metal and semiconductor materials actually melt and meld together. However, where semiconductor junctions or other thin film layers are close to the surface, such melting for alloying can disrupt or destroy the semiconductor structure or functions. Thus, a slightly lower temperature to produce sintering, which merely breaks down the interface oxide and remains more localized at the interface surfaces, may be more appropriate than alloying in those situations. Also, where there is heavy doping of the silicon, such as near a p-n or n-p junction, electrical contact between the doped silicon and the metal contact is easier to establish. Consequently, sintering, rather than full fledged alloying, is usually sufficient. Therefore, it has become a general practice in the industry, particularly for solar cells and other optoelectric devices, to alloy bottom metal contact layers to the bottoms of semiconductor substrates, while the top contacts, which are usually thin strips or grids near the junction, are only sintered to the top surface of the semiconductor material.

In one conventional type of alloying process, metallized semiconductors, i.e., semiconductor substrates with metal contacts deposited thereon, are heated in an alloying furnace to a sufficiently high temperature to melt both the metal and the immediately adjacent substrate material enough to form an alloy of the metal and substrate material, thereby improving the bond between the two materials and producing the desired electrical and mechanical characteristics. Such furnace alloying is frequently performed at temperatures in excess of 400° C. and for as long as 30 minutes. Exposing the metallized semiconductor to such temperatures in a furnace over such an extended time heats up the entire semiconductor structure uniformly and creates an isothermal condition within the semiconductor. Unfortunately, such heating deep into the semiconductor material tends to produce a detrimental phenomenon known as "spiking." Spiking is caused by the dissolution of certain isolated "weak" pockets in the semiconductor material and the subsequent infusion of the metal layer into those dissolved pockets to form metallic intrusions into the surface of the semiconductor material. Viewed in cross-section, these intrusions of infused metal have an uneven, jagged, or spike-like appearance, thus giving rise to the term "spikes." Depending upon their depth of penetration, such metal spikes can and often do interfere with various subsurface layers of the semiconductor or the p-n junction itself, thereby rendering the device inoperative. Another common problem in conventional furnace alloying processes is the formation of "hillocks" in the metal layer. As the name implies, hillocks are small mounds that form on the surfaces of the metal layers. They are typically about 1 micrometer high and may occur in densities of about $10^5$ hillocks per square centimeter. Hillocks create reliability problems by interfering with the subsequent laying down of interlevel dielectric layers or passivating oxide layers. Such hillocks are the result of compression of the metal layers due to thermal expansion and softening of the metal as it approaches its melting point. The softening of the metal layer allows the compression forces created by thermal expansion to be relieved in the form of hillocks.

Another problem with the furnace alloying process is that the atmosphere around the metallized semiconductor and the entire furnace are heated along with the individual metal layers or contacts and the semiconductor substrate. Not only does this heating of the atmosphere around the semiconductor waste energy, it also encourage degradation of the electrical characteristics of the metal layers due to atmospheric impurities. One form of this degradation is oxidation, which significantly degrades the electrical characteristics of the metal layer. It is wellknown that even small traces of oxygen in the atmosphere surrounding the metallized semiconductor can oxidize the metal layer. Consequently, most furnace alloying processes require that the process be performed in a vacuum, or they require the use of a highly purified inert atmosphere, such as argon or helium, to reduce oxidation of the metal layers. Obviously, the creation of such special, purified environments is both time consuming and expensive.

Several techniques have been developed recently in attempts to solve these problems of spiking, hillocks, and oxidation associated with the conventional furnace alloying process described above. One such technique involves heating a graphite strip to a high temperature in an inert environment and then placing the heated graphite strip in contact with the metallized semiconductor. The heat from the graphite strip is transferred to the metallized semiconductor, alloying the metal layers to the semiconductor substrate. The primary advantage associated with graphite heating is that it is easier to control the amount of heat absorbed by the metallized semiconductor, thereby reducing the spiking and hillock problems described above. However, this process must still be performed under vacuum or in inert atmospheres to reduce the chances of oxidation. Further, this process only heats the metallized semiconductor from one side, which may lead to spiking or hillock formation.

Another, more popular alloying technique, commonly referred to as optical processing or rapid thermal alloying (RTA), bombards the metallic depositions on the semiconductor from the solid metal bottom side, or from all sides, for a few seconds with pulsed, high intensity visible and infrared light, such as light produced by a high intensity CW visual light lamp. This pulsing of the metallized semiconductor with light results in a rapid rise in the temperature of the metal layers and the semiconductor substrate, thereby alloying the metal with the semiconductor substrate. The patent issued to Salathe et. al., U.S. Pat. No. 4,335,362, describes a slight variation of this RTA technique, wherein narrow regions of the metallic layers are alloyed with the semiconductor by heating the regions with a focused beam from a Nd:YAG (four-level infrared) laser. Other examples of these techniques can be found in U.S. Pat. No. 4,359,486 issued to Patalong et. al., U.S. Pat. No. 4,525,221 issued to Wu, and U.S. Pat. No. 4,566,177 issued to van de Ven et. al.

Unfortunately, however RTA suffers some of the same drawbacks as the furnace alloying process. For example, the RTA process usually illuminates a semiconductor device from both the top and bottom sides, the bottom side typically being the solid metal base or contact. Because the metal deposited on the bottom side is reflective, the outside surface of the bottom metal layer reflects a substantial portion of the incoming electromagnetic radiation back to the surrounding atmosphere, heating both the atmosphere and the outer surface of the metal. Of course, heating the outside surface of the metal enough to alloy the inside surface of the metal to the semiconductor substrate only exacerbates the contamination and oxidation problems described above. Accordingly, the RTA process must also be performed under vacuum or in an inert environment. Even with such special inert environments, oxidation is still so prevalent in RTA that it is common to redeposit a metal layer over the alloyed metal in an attempt to regain the electrical integrity of the oxidized metal.

Furthermore, the RTA process typically needs to be repeated several times when fabricating devices that require both alloyed and sintered metal contacts, once for the alloyed contact and again for the sintered contacts. For example, in my paper entitled "Fabrication of Diode Arrays for Photovoltaic Characterization of Silicon Substrates," published in Appl. Phys. Lett. 52(20), May 16, 1988, described a process in which the back contact was to be alloyed to the semiconductor for good adhesion and electrical contact, but the front contact was to only be sintered to the semiconductor material to avoid spiking and other intrusion into, or degradation of, the semiconductor junction in the top semiconductor layers. In that article, I mentioned that the back aluminum contact of a diode array could be alloyed by placing the metallized substrate under high intensity lamps for a sufficient time to reach the required high alloying temperature. However, this process had to then be repeated with a lesser exposure time only to sinter the front contacts. Therefore, after the alloying step was completed for the back contact, the process chamber had to be opened, so the top contacts could be deposited on the semiconductor and then repositioned in the vacuum chamber for sintering the top contact to the semiconductor at a lower temperature. Such multistep processing increases the time and cost involved, and it increases the chances of the device being contaminated between steps. Therefore, while replacement of the furnace alloying process with RTA processes or techniques has reduced the formation of spikes and hillocks, reduced energy requirements to some extent, and increased throughput, such RTA techniques have not completely eliminated the problems associated with the furnace alloying procedures. For example, the RTA processes have not completely eliminated the formation of spikes and hillocks. Consequently, a certain percentage of metallized semiconductors will still have defective metal to semiconductor bonds, reducing the numbers of functional and reliable devices. Further, although the RTA processes described above reduce the energy requirements over the furnace alloying process, these processes still require relatively large amounts of optical power to heat the metallized semiconductor to a temperature sufficiently high to alloy the bottom metal layer to the semiconductor substrate, since a large portion of the electromagnetic energy is reflected by the outside surface of the bottom layer. Consequently, the RTA processes still heat the surrounding atmosphere and equipment, including the RTA chamber walls, to very high temperatures.

Additionally, in the fabrication of multilayered semiconductor devices with RTA or furnace alloying processes, where one is to be alloyed at a high temperature and the other is to be sintered at a lower temperature, the separate metal contacts on the front and back require separate processing steps at different temperatures. Lastly, because both RTA and furnace alloying processes heat the surrounding environment as well as the metal and semiconductor, there is a good chance that the metal contacts will be contaminated by residual traces of oxygen in the ambient surroundings.

SUMMARY OF THE INVENTION

Accordingly, it is an object of this invention to provide a method of simultaneously alloying one metal layer to a semiconductor at one temperature (high) and sintering another metal layer on the semiconductor substrate at a second (lower) temperature, all in a single step.

It is another object of this invention to provide a method of sintering and alloying metal layers on a semiconductor substrate simultaneously without overheating any portions of the metallized semiconductor.

It is yet a further object of the present invention to provide a significant reduction in the optical power required to sinter and alloy a metal with a semiconductor.

It is still another object of this invention to provide a method for reducing the number of processing steps required for the fabrication of multilayered semiconductor devices.

Yet another object of this invention is to provide a method of alloying and sintering metal contacts on a semiconductor substrate that is less susceptible to contamination and oxidation, without the need to provide a reducing atmosphere or a vacuum.

Another specific object of this invention is to provide a method of sintering a reflective front metal contact deposited on a nonreflecting surface by irradiation normal to the surface of the reflective front metal contact.

Another specific object of this invention is to provide a method of simultaneously alloying a metal to the back surface of a multilayered semiconductor device while sintering reflective metallic strips on its front surface by irradiation on that front face, without isothermally heating the entire device or its surroundings such that neither the alloyed nor sintered interfaces are degraded.

Additional objects, advantages, and novel features of the invention shall be set forth in part in the description that follows, and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purpose of the present invention, as embodied and broadly described herein, the method of this invention includes simultaneously sintering metal strip contacts to a top surface of a semiconductor at one temperature while alloying a metal contact layer to the bottom surface at a higher temperature by illuminating the semiconductor substrate with electromagnetic radiation from the top surface only with an electromagnetic radiation spectrum that is tuned to provide sufficient heat to alloy the bottom metal layer to the semiconductor substrate while only sintering the metal strips to the top surface of the semiconductor. The illuminating radiation, preferably weighted with more infrared light, depending on the materials being used, such as wavelengths of about 700 nanometers, is substantially transmitted through the semiconductor substrate to the interface between the bottom layer of metal and the bottom surface of the semiconductor substrate. This incident radiation at the bottom interface heats the interfacing bottom metal layer and substrate material to a temperature sufficient to alloy the metal with the semiconductor. At the same time, the metal strips on the top surface are sintered at a lower temperature to the top surface of the semiconductor substrate.

BRIEF DESCRIPTION OF THE DRAWINGS

The accompanying drawings, which are incorporated herein and form a part of the specification illustrate preferred embodiments of the present invention, and together with the description, serve to explain the principles of the invention. In the drawings.

DETAILED DESCRIPTION OF THE PREFERRED EMBODIMENT

Figure 1:
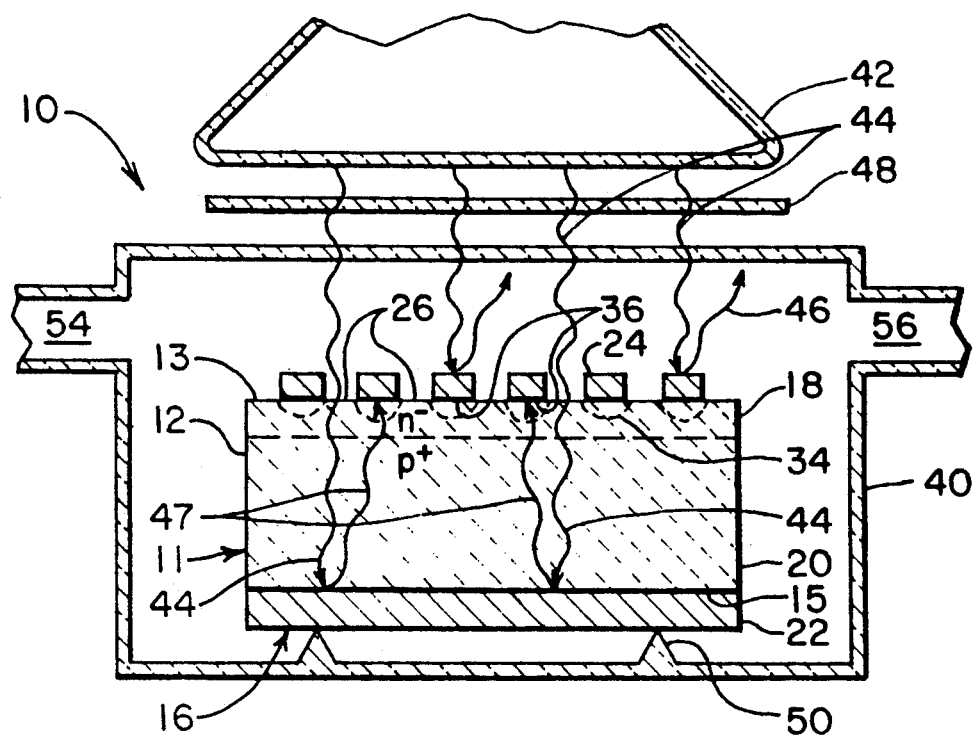
FIG. 1 is an enlarged cross-sectional view of a multilayered semiconductor device, such as an integrated circuit or solar cell, that is being simultaneously alloyed and sintered within a quartz chamber according to this invention such that the metal layer on the bottom of the semiconductor substrate is being alloyed while the metal strips on the top are being sintered.

The one directional reverse illumination method 10 according to the present invention is illustrated in FIG. 1 simultaneously sintering top metal strip contacts 24 on the top surface 13 of semiconductor substrate 12 and alloying the bottom metal contact layer 22 with the bottom surface 15 of semiconductor substrate 12. Briefly stated, the reverse illumination method 10, according to this invention, involves placing a metallized semiconductor device 11 in a quartz muffle 40 and irradiating it with electromagnetic radiation 44 comprising mostly infrared, but also some visible and ultra violet, from a light source 42. The substrate 12 is mostly transparent to infrared, so non reflective regions 26 between metal strip contacts 24 on the top surface 13 of semiconductor 12 transmit most of the infrared radiation 44 to the bottom metal layer 22 adjacent bottom surface 15. A substantial portion of this transmitted infrared radiation 44 is absorbed and converted rapidly and intensely to heat at the interface of the metal layer 22 with semiconductor material 12 thereby creating a primary hot spot, in a process that is not yet very well understood.

It appears that there may be some interface optical activity, such as enhanced interface diffusion, that greatly enhances the radiation absorption and conversion to heat at the metal/substrate interface way beyond any normal absorption by either the metal 22 or the substrate surface 15 alone. In fact, it has been found that once this interface heating gets started, it will accelerate rapidly to a point where it has to be monitored diligently and the radiation lamp 42 turned off quickly before it gets hot enough to melt the entire metal 22. When properly controlled, however, with appropriate illumination time and intensity, the resulting heat at this primary hot spot at the interface of the metal layer 22 and the substrate 12 causes a portion of the metal 22 and the substrate 12 to melt together or alloy, thereby forming an alloyed layer 28 (FIG. 2).

At the same time, the metal strips 24 on the top surface 13 of the semiconductor 12 reflect most, usually about 90%, of the incoming radiation 44 as reflected rays 46. However, there is still enough heat generated in this system to create secondary hot spots 34 under the metal contact strips 24. These secondary hot spots 34 are not as hot as the primary hot spot described above, but their temperatures do get high enough to cause simultaneous sintering of the metal contact strips 24 to the top surface 13 of the substrate 12 while the alloy layer 28 is being formed. Most of the heat for these secondary hot spots 34 is believed to be provided by absorption of some of the electromagnetic radiation, particularly visible and ultraviolet portions of the spectrum, in the upper layers of the substrate 12, as well as additional conduction of heat from the primary hot spot through the substrate. Some additional heat at these hot spots, however, is probably also created by some infrared radiation 47 reflected by the bottom metal contact 22 back up through the substrate 12 to the interfaces between metal contact strips 24 with the top surface 13 of substrate 12, where interfacial radiation absorption takes place similar to that described above. Therefore, the intensity and spectrum distribution of the radiation 44 has to be tuned or adjusted, depending on the specific metal and substrate materials, thicknesses, and other characteristics, as well as the exposure time used, to produce the required respective alloying and sintering temperatures for the bottom contact 22 and top contacts 24 simultaneously.

This method of alloying metal 22, according to this invention, with the bottom surface 15 of semiconductor 12 without illuminating the back surface 16 of metal 22 is referred to in this specification as one-directional reverse illumination, because the illumination is from just one side of the device 11, usually the top side that has only strip contacts 24, as opposed to conventional optical alloying, which directs light from at least the bottom metal side, if not from all directions, and because the back surface 16 of metal strip 22 is not irradiated directly at all.

Figure 2:
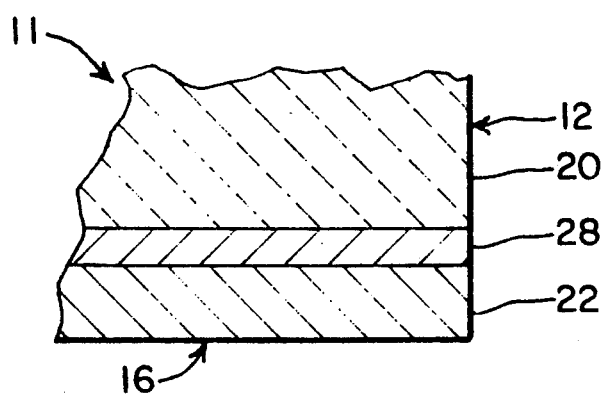
FIG. 2 is an enlargement of the bottom metal layer and semiconductor interface of the multilayered semiconductor device of FIG. 1 after the bottom metal layer and semiconductor substrate have been alloyed.

Referring to FIGS. 1 and 2, the fabrication of a semiconducting device 11 usually begins with a silicon substrate 12 having a top surface 13 and a bottom surface 15. For the purpose of providing a detailed description and an enabling embodiment, but not for the purpose of limitation, this description refers to a silicon semiconductor 12 that is doped, or treated, to create an n-type region 18 and a p-type region 20. The metal deposited on this silicon semiconductor 12 is aluminum. However, the method 10 of the present invention can be used on all types of metallized semiconductors, and the present invention should not be regarded as limited to the specific metallized semiconductors shown and described herein.

The bottom layer of aluminum 22 is deposited on p-type region 20, and a series of aluminum strips 24 are deposited on the top surface 13 of n-type region 18. The metal contact strips 24 deposited on the surface 13 of substrate 12 create a mosaic or grid of metal surfaces 24 intermixed with exposed surfaces 26 of the semiconductor material, which is usually more or less non-reflective, depending on the particular substrate or semiconductor material being used.

Following the deposition of aluminum contact layer 22 and aluminum contact strips 24 on silicon substrate 12, the device 1 is placed in a quartz muffle or chamber 40, which may contain stands 50 to support device 11. Device 11 is then illuminated from above, preferably by mostly infrared radiation, i.e., having wavelengths of about 700 nanometers or longer, such as from a tungsten-halogen lamp 42. The infrared radiation 44 is incident on top surface 13 of silicon substrate 12 and on aluminum strips 24. The incoming radiation 44 that is incident on the nonreflective regions 26 of the semiconductor 12, at least to the extent of the infrared components, is mostly transmitted, while most of the electromagnetic radiation 44 incident on aluminum strips 24 is reflected as indicated at 46.

The long wavelength infrared radiation 44 transmitted by regions 26 is easily transmitted through n-type region 18 and p-type region 20 of the silicon substrate 12 and strikes the surface of metal layer 22 that interfaces with bottom surface 1 of the substrate 12. Since the silicon substrate 12 transmits the relatively long wavelength infrared radiation 44 with little absorption, which is a characteristic of this type of material, there is little or no extraneous heating of the silicon substrate 12 from the infrared portion of radiation 44. However, most of this transmitted infrared radiation 44 is absorbed at the interface of metal 22 with bottom surface 15 and is converted to heat sufficient to melt and alloy the metal 22 to the bottom surface 15 of p-type silicon 20, as described above, creating a clean and uniform Si-Al alloy region 28, as seen in FIG. 2.

Referring back to FIG. 1, while most of the heat is concentrated at the metal 22 and silicon 15 interface, as described above, a substantial amount of that heat generated at that interface or primary hot spot region is conducted throughout the substrate 12. That dispersed heat, supplemented by additional heat created by absorption of visible and ultraviolet components of radiation 44 in the upper portions of the semiconductor 11, especially in the junction region, as well as heat created at the interfaces of the metal strips 24 with the silicon surface 13 by infrared 47 reflected back from metal layer 22, as described above, creates secondary hot spots or regions 34 directly below metal strips 24. These secondary hot regions 34, not being hot enough to melt and alloy aluminum metal strip 24 with the n-type silicon material 18, is nevertheless hot enough to sinter the metal strips 24 to top surface 13.

The result, as described above, is a unitary, but differential temperature heating by infrared from a source shining down from the top only, such that it is incident on the bottom metal layer 22 only through the substrate 12 and not from the bottom. This arrangement advantageously causes dual temperature heating zones simultaneously. The primary hot spot or heating zone at the interface of bottom metal layer 22 and silicon surface 15 is hot enough to alloy the metal 22 and silicon at region 28, while the secondary hot spots or temperature regions 34 under metal strips 24 are less hot, but still hot enough to sinter the metal strips 24 at the silicon interfaces 36.

While the method of this invention results in minimal heating of the atmosphere immediately surrounding the device 11, it is preferred, though not required, to perform this alloying and sintering process in an inert environment, to eliminate any chance of contamination or oxidation. Such an inert environment could be created by providing quartz chamber 40 with an inlet port 54 and outlet port 56, as seen in FIG. 1. Inlet port 54 allows for the inlet of a inert gas, such as argon. However, other inert or reducing gases such as hydrogen could be used with equal effectiveness. Outlet port 56 provides an exit for the processing gas and provides a means for continually flowing the inert gas through chamber 40 during the one-directional reverse illumination process 10 according to the present invention. The preferred embodiment uses a tungsten-halogen lamp as light source 42, because its output spectrum can be easily adjusted by varying the operating voltage. An operating voltage for the system described above should preferably be selected that will produce light having a peak output wavelength of about 710 nanometers, because it is readily transmitted by silicon semiconductors, and will not substantially heat the silicon until it strikes bottom layer 22. A filter 48 may be optionally used to filter unwanted wavelengths, which might otherwise be absorbed by silicon substrate 12, causing unwanted heating. However, other wavelengths or spectrums would be more appropriate for other materials that can be processed within the scope of this invention. Therefore, by controlling the intensity and spectral content of the radiation 44, as well as the exposure time, it is possible to simultaneously control the thickness of the alloy layer 28 and the sintering conditions for the metal strips 24 as is most appropriate or optimum for the specific semiconductor and metal materials being used in any system.

Because the alloying and sintering steps are performed simultaneously, the method of this invention eliminates the need to perform these steps individually. Table 1 compares the various steps necessary to carry out the alloying and sintering processes by the method 10 of the present invention and by conventional RTA or furnace alloying processes. Note that, for simplicity, mutually shared steps in the overall fabrication process, such as masking, etching, and cleaning, have not been included. Only those steps that are in addition to the mutual masking, etching, and cleaning steps are included in Table 1.

TABLE 1

COMPARISON OF PROCESS STEPS

| Furnace Anneal or RTA | One-Directional Reverse Illumination Method 10 of the present invention |
|---|---|
| 1. Deposit Al on Back | 1. Deposit Al on Front and Back |
| 2. Alloy Back Al | 2. Sinter and Alloy |
| 3. Strip Excess Al in HCl, Rinse in DI Water, and Dry in Nitrogen | |
| 4. Diluted HF Dip (or Fume) | |
| 5. Deposit Al on Front | |
| 6. Sinter Front Al | |
| 7. Deposit Additional Al on back (to reduce sheet resistivity) | |

Obviously, the one-directional reverse illumination method 10 according to the present invention eliminates numerous processing steps, substantially increasing the throughput.

EXAMPLE

The following example is presented for illustrative purposes only, and is not intended to limit the scope of the invention as herein described or as set forth in the appended claims.

A 250-300 micrometer integrated circuit silicon wafer 12 made of p-type material 20 was treated in an unmasked $PH_3$ diffusion at 850° C. to create an n-type layer 18 to a depth of about 0.3 micrometers. Aluminum layer 22 was then deposited on back surface 15 to a depth of about 50 micrometers and aluminum strips 24 were evaporated over a photoresist mask (not shown) to a depth of about 0.1 micrometers. Device 11 was then placed in a quartz muffle 40 with bottom layer 22 away from the incident illumination, as shown in FIG. 1. A tungsten-halogen lamp 42 was adjusted to deliver an output spectrum with a peak wavelength at 710 nanometers and illuminated for about 10 seconds. During this optical sintering/alloying process argon gas was allowed to flow through ports 54, 56.

The front Al-Si interface 36 was found to be abrupt, without any punch-through across the n-p junction, or other significant transport of aluminum 24 into the silicon 12. This indicates there was no spiking or alloying of the aluminum 24 with the n-type material 18. The bottom face, however, formed a composite layer consisting of aluminum or an aluminum rich phase of Si:Al alloy at bottom surface 15 of p-type material 20 to an estimated depth of about of about 0.02 micrometers. Essentially, this Si:Al alloy formed a uniform epitaxial layer.

Since nearly all silicon solar cells and optoelectronic devices are fabricated on p-type substrates, the preferred embodiment of the present invention has been described with reference to a p-type substrate. However, it should be understood that similar steps will apply to n-type material, as n-type and p-type fabrications are essentially the same. Similarly, the metal contacts described have been aluminum, as it is one of the more common metals used in semiconductor chip construction; however, the method 10 of the present invention could be applied with equal effectiveness to other metals, such as, for example, nickel (Ni), copper (Cu), silver (Ag), gold (Au), titanium (Ti), and lead (Pb). Further, it should be understood that this principle of selectively delivering energy to a predetermined interface can be applied to a wide variety of layered structures, with similar results.

One of the advantages in the one-directional reverse illumination method 10 of the present invention is that it produces a uniform and consistent alloyed layer 28 between semiconductor 12 and bottom metal layer 22. See FIG. 2. Further, the method of this invention will work with semiconductors of all shapes and sizes, producing a large, uniform, alloyed layer. Because the electromagnetic radiation is directed where it is needed, i.e., at interface of bottom surface 15 and metal layer 22, there is little or no excess heating of bottom metal layer 22 or semiconductor substrate 12, thereby preventing spiking and the formation of hillocks.

Another advantage of the present invention is that it requires significantly less power than either the RTA or furnace alloying processes previously used. That is, the method 10 of the present invention does not heat unnecessary portions of the semiconductor device, nor does it significantly heat the surrounding atmosphere or the chamber walls or other equipment components, since the back side 16 of metal layer 22 is not uselessly heated by incident radiation, as in the prior art. Instead, nearly all the energy from the incoming electromagnetic radiation is directed to where it is needed; to the metal-semiconductor interface.

An additional advantage in not heating the outside of the metal layer or contact 22 and, consequently, its surrounding environment, is that contamination from atmospheric impurities is minimized. That is, since the electromagnetic energy is directed directly to the interface between back surface 15 and metal layer 22, little heating of the outside surface 16 of metal layer 22 occurs, thereby reducing the susceptibility of the outside surface 16 to oxidation. Finally, the present invention saves several of the normal processing steps in standard semiconductor device processing because of the ability of the method 10 of the present invention to simultaneously sinter and alloy metal contacts to the semiconductor substrate.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to falling within the scope of the invention as defined by the claims that follow.

The embodiments of the invention in which an exclusive property or privilege is claimed are defined as follows:

1. A method of simultaneously alloying a metal layer deposited on a first surface of a transparent semiconductor substrate and sintering metal strips deposited on a second surface of the substrate that is opposite said first surface comprising the step of:

illuminating the second surface of the semiconductor substrate with electromagnetic radiation having a wavelength that is substantially transmitted by the semiconductor substrate and substantially absorbed at the interface of the metal layer with the first surface for a time sufficient to melt and alloy the metal layer with the semiconductor substrate and to sinter the metal strips to the second surface of the semiconductor substrate.

2. The method of claim 1, including the step of positioning the substrate in an inert environment prior to the step of illuminating the semiconductor substrate with electromagnetic energy.

3. The method of claim 2, including the step of illuminating said semiconductor substrate with electromagnetic energy from a direction normal to and second surface.

4. The method of claim 3, wherein said electromagnetic energy includes wavelengths in the infrared region.

5. The method of claim 4, including the step of providing said electromagnetic energy with a tungsten-halogen lamp.

6. The method of claim 5, including the step of illuminating said substrate for about 10 seconds.

7. The method of claim 1, including the step of also including in said electromagnetic radiation a sufficient amount of radiation of an additional wavelength that is absorbed by said substrate to create additional heat in said substrate adjacent said second surface for sintering the metal strips to the second surface.

8. The method of claim 7, including the step of providing said radiation with proportions of said wavelengths that are transmitted in relation to said wavelengths that are absorbed such that a first temperature hot enough to alloy said metal layer with said substrate is produced at said first surface simultaneously with a second temperature that is produced at said second surface that is not as hot as said first temperature but is still hot enough to sinter said metal strips to said second surface.

9. The method of claim 7, wherein said additional wavelength radiation includes visible light radiation.

10. The method of claim 7, wherein said additional wavelength radiation includes ultraviolet radiation.

* * * * *